US006984950B2

(12) United States Patent
Jonsson et al.

(10) Patent No.: US 6,984,950 B2
(45) Date of Patent: Jan. 10, 2006

(54) SYSTEM AND METHOD FOR CONFIGURING A MOTOR CONTROLLER WITH AN EXTERNAL DEVICE

(75) Inventors: Gregg Jonsson, Batavia, IL (US); Scott Mayhew, North Aurora, IL (US); Daniel Zuzuly, Geneva, IL (US); Scott Wakefield, Plano, IL (US); Glenn Orin Ray, Sugar Grove, IL (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 221 days.

(21) Appl. No.: 10/252,326

(22) Filed: Sep. 23, 2002

(65) Prior Publication Data

US 2004/0056619 A1 Mar. 25, 2004

(51) Int. Cl.
*H02P 5/00* (2006.01)
*H02P 7/00* (2006.01)
*G05B 15/00* (2006.01)

(52) U.S. Cl. .................. 318/440; 318/268; 318/567; 318/446; 700/83; 700/275

(58) Field of Classification Search .......... 318/440, 318/268, 567, 446, 811, 801, 581, 599; 700/83, 700/275; 701/2, 22; 187/277, 191, 413
See application file for complete search history.

(56) References Cited

U.S. PATENT DOCUMENTS

| 4,988,992 | A | * | 1/1991 | Heitschel et al. | ...... 340/825.69 |
| 5,042,621 | A | * | 8/1991 | Ovaska et al. | ............. 187/393 |
| 5,250,765 | A | * | 10/1993 | Mizuno et al. | ............. 187/316 |
| 5,412,291 | A | | 5/1995 | Payne et al. | ................ 318/102 |
| 5,616,894 | A | * | 4/1997 | Nieminen et al. | .......... 187/247 |
| 5,736,692 | A | * | 4/1998 | Lumme et al. | ............. 187/247 |
| 5,817,994 | A | * | 10/1998 | Fried et al. | ................. 187/391 |
| 5,929,400 | A | * | 7/1999 | Colby et al. | ................ 187/393 |
| 5,929,580 | A | * | 7/1999 | Mullet et al. | ................ 318/466 |
| 6,072,429 | A | * | 6/2000 | Crothall et al. | .......... 342/357.1 |
| 6,326,754 | B1 | * | 12/2001 | Mullet et al. | ................ 318/480 |
| 6,335,870 | B1 | | 1/2002 | Sakurai | ........................ 363/34 |
| 6,430,471 | B1 | * | 8/2002 | Kintou et al. | ................ 700/245 |
| 6,445,966 | B1 | * | 9/2002 | Younger et al. | ............... 700/83 |
| 6,446,761 | B1 | * | 9/2002 | Motoyama et al. | ......... 187/391 |
| 6,597,143 | B2 | * | 7/2003 | Song et al. | .................. 318/581 |
| 6,605,918 | B2 | * | 8/2003 | Mayhew et al. | ............ 318/727 |
| 6,611,205 | B2 | * | 8/2003 | Guthrie et al. | ........... 340/545.1 |

FOREIGN PATENT DOCUMENTS

| EP | 1 037 375 A2 | 9/2000 |
| EP | 1 154 623 A2 | 11/2001 |
| WO | WO 02/21224 A1 | 3/2002 |

OTHER PUBLICATIONS

PCT, International Search Report mailed Nov. 14, 2003.

* cited by examiner

Primary Examiner—Marlon T. Fletcher
Assistant Examiner—Patrick Miller

(57) ABSTRACT

A remotely configurable motor controller system comprises a motor controller and a remote configuration device. The motor controller includes solid state switches for connection between an AC line and motor terminals for controlling application of AC power to the motor and a control circuit for controlling operation of the solid state switches. The control circuit comprises a programmed processor for commanding operation of the solid state switches and a memory connected to the programmed processor storing configuration information relating to operation of the solid state switches. A wireless communication interface is operatively connected to the programmed processor. The remote configuration device includes a remote user interface for selecting parameters for the stored configuration information and a wireless communication interface for wireless communication with the motor controller so that the user interface is operable to configure the motor controller by updating the stored configuration information using the selected parameters.

21 Claims, 10 Drawing Sheets

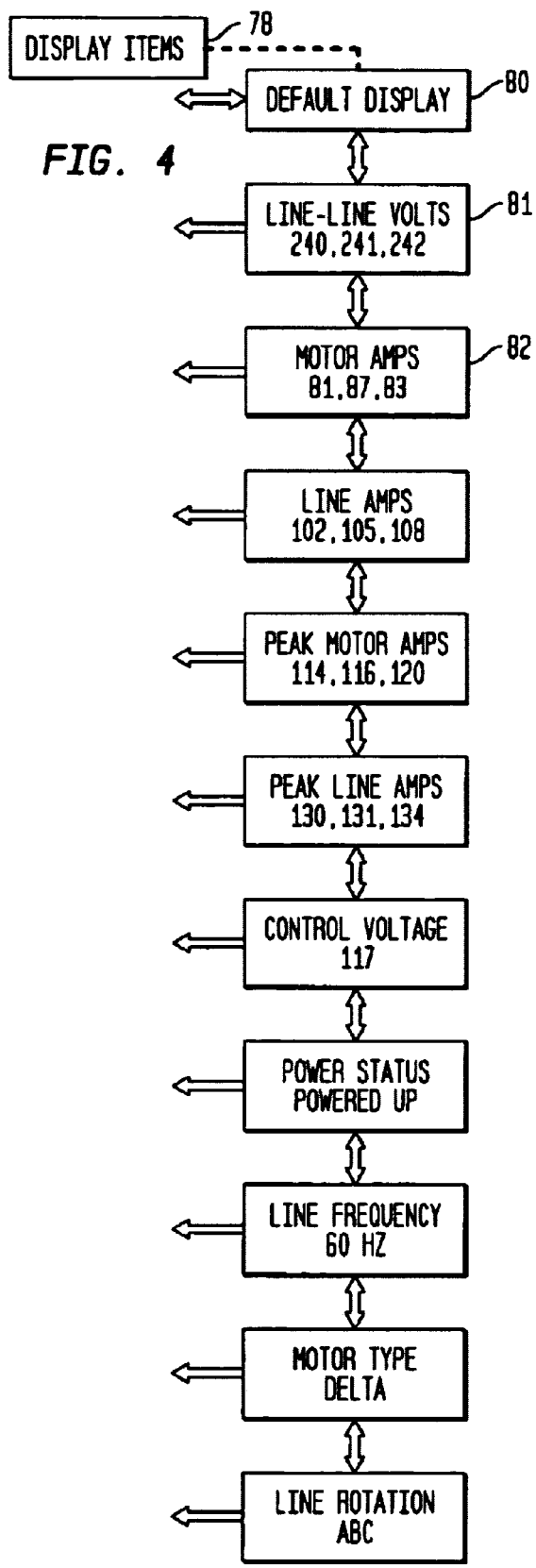

SYSTEM AND METHOD FOR CONFIGURING A MOTOR CONTROLLER WITH AN EXTERNAL DEVICE

CROSS REFERENCE TO RELATED PATENT APPLICATIONS

The present U.S. patent application having at least one common inventor as

U.S. patent application Ser. No. 10/252,618 entitled "System and Method for Monitoring Currents and for Providing Motor Protection", and U.S. patent application Ser. No. 10/252,635 entitled "System and Method for Individual Phase Motor Over Voltage Protection", and U.S. patent application Ser. No. 10/252,637 entitled "System and Method for Automatic Current Limit Control", and U.S. patent application Ser. No. 10/252,327 entitled "System and Method for a Configurable Motor Controller", are filed with the U.S. patent and Trademark Office concurrently on Sep. 23, 2002, the entirety of each being incorporated herein by reference.

FIELD OF THE INVENTION

This invention relates to a motor controller and more particularly, a system and method for configuring a motor controller with an external device.

BACKGROUND OF THE INVENTION

Solid state starters/controllers have found widespread use for controlling application of power to an AC induction motor. The conventional starter/controller, referred to hereinafter as simply a controller, uses solid state switches for controlling application of AC line voltage to the motor. The switches may be thyristors such as silicon controlled rectifiers (SCRs) or triacs.

Conventional controllers include a housing enclosing the solid state switches and a control circuit for controlling operation of the solid state switches. For configuring controller operation the motor controller may include digital selectors switches for setting functions and ranges. Indicator lights, such as LEDs, may be used for status indication. While such a user interface may be adequate for configuring the motor controller, the user interface may not be considered user friendly to some end users.

The present invention is directed to improvements in configuring motor controllers.

SUMMARY OF THE INVENTION

In accordance with the invention, there is provided a system and method for remotely configuring a motor controller with an external device.

Broadly, in accordance with one aspect of the invention there is disclosed a method of configuring a motor controller with an external device, comprising: providing the motor controller to include solid state switches for connection between an AC line and motor terminals for controlling application of AC power to the motor, and a control circuit for controlling operation of the solid state switches, the control circuit comprising a programmed processor for commanding operation of the solid state switches, and a memory circuit connected to the programmed processor storing configuration information relating to operation of the solid state switches; providing the external device to include a remote user interface for selecting parameters for the stored configuration; and establishing wireless communications between the programmed processor and the external device so that the user interface is operable to configure the motor controller by updating the stored configuration information using the selected parameters.

It is a feature of the invention that the wireless communication is established using a wireless communication module operatively connected to the programmed processor. The wireless communication module may be connected to a connector which is operatively connected to the programmed processor.

It is another feature of the invention that the motor controller is further provided with a local user interface operatively connected to the programmed processor for alternatively selecting parameters for the stored configuration information locally.

It is still another feature of the invention to provide an infrared communication path between the programmed processor and the external device.

There is disclosed in accordance with another aspect of the invention a remotely configurable motor controller system. The system comprises a motor controller and a remote configuration device. The motor controller includes solid state switches for connection between an AC line and motor terminals for controlling application of AC power to the motor and a control circuit for controlling operation of the solid state switches. The control circuit comprises a programmed processor for commanding operation of the solid state switches and a memory connected to the programmed processor storing configuration information relating to operation of the solid state switches. A wireless communication interface is operatively connected to the programmed processor. The remote configuration device includes a remote user interface for selecting parameters for the stored configuration information and a wireless communication interface for wireless communication with the motor controller so that the user interface is operable to configure the motor controller by updating the stored configuration information using the selected parameters.

There is disclosed in accordance with a further aspect of the invention a remotely configurable motor controller system comprising a housing. Solid state switches in the housing are provided for connection between an AC line and motor terminals for controlling application of AC power to the motor. A control circuit in the housing controls operation of the solid state switches. The control circuit comprises a programmed processor for commanding operation of the solid state switches and a memory connected to the programmed processor storing configuration information relating to operation of the solid state switches. A wireless communication interface module is mounted to the housing and is operatively connected to the programmed processor. A remote configuration device includes a remote user interface for selecting parameters for the stored configuration information and a wireless communication interface for wireless communication with the motor controller so that the user interface is operable to configure the motor controller by updating the stored configuration information using the selected parameters.

There is disclosed in accordance with a further aspect of the invention a remotely configurable motor controller system comprising a housing. Solid switch means are in the housing for the connection between an AC line and motor terminals for controlling application of AC power to the motor. Control means in the housing control operation of the solid state switches. The control means are programmable for commanding operation of the solid state switches. Memory means stores configuration information relating to operation of the solid state switches. First wireless communication means are operatively connected to the control means. A remote configuration means includes a remote user interface for selecting parameters for the stored configuration information and a second wireless communication means for wireless communication with the first wireless communication means so that the user interface is operable to configure the motor controller by updating the stored configuration information using the selected parameters.

Further features and advantages of the invention will be readily apparent from the specification and from the drawings.

BRIEF DESCRIPTION OF THE DRAWINGS

FIGS. 4–11 are individual flow diagrams illustrating user interface menu operations implemented by the user interface module of FIG. 3.

DETAILED DESCRIPTION OF THE INVENTION

Figure 1:
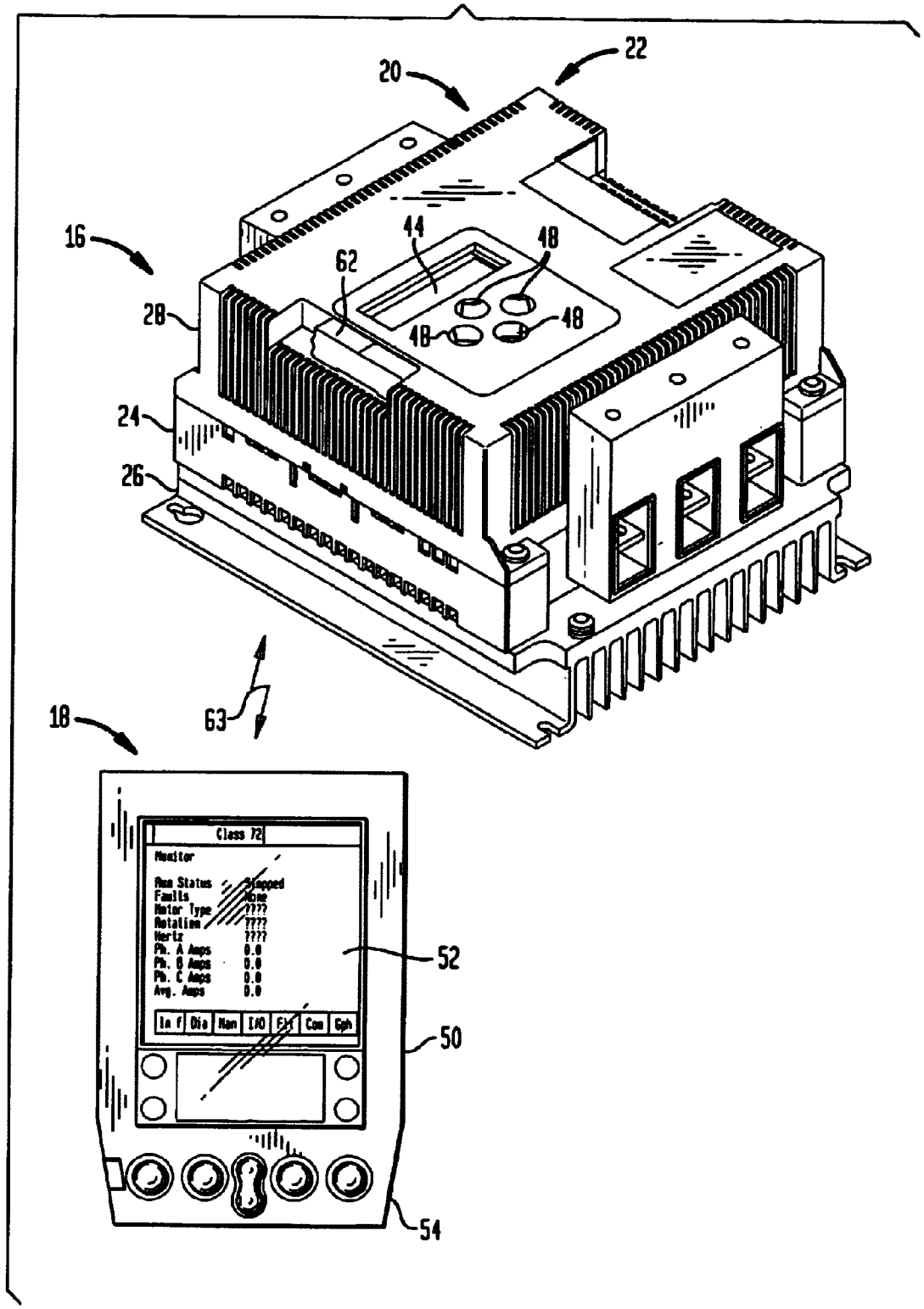
FIG. 1 is a perspective view of a remotely configurable motor controller system in accordance with the invention.

Referring initially to FIG. 1, a remotely configurable motor controller system 16 in accordance with the invention is illustrated. The remotely configurable motor controller system 16 includes a remote configuration device 18 and a solid state starter/controller 20, referred to hereinafter as simply a controller.

One application for the controller 20 is as an elevator starter. The motor controller 20 may be used to drive a pump for an hydraulic elevator. Each time movement of an elevator car is commanded, then the motor controller 20 must start the elevator motor until it reaches operating speed and then operate in a run mode. Such a motor controller 20 may only be used for the up direction as gravity may be used for the down direction.

The motor controller 20 comprises a housing 22 including a housing base 24, a heat sink 26 and a cover 28. The motor controller 20 includes a plurality of solid state switches 32 in the form of thyristors, such as back to back connected silicon controlled rectifier (SCR) pairs, see FIG. 2. For simplicity herein, the SCR pairs 32 are referred to as simply SCRs. Triacs could also be used. The SCRs 32 control application of three phase AC line voltage to a three phase motor. As is apparent, a different number of SCRs 32 could be used to control different numbers of phases, as is apparent to those skilled in the art.

Figure 2:
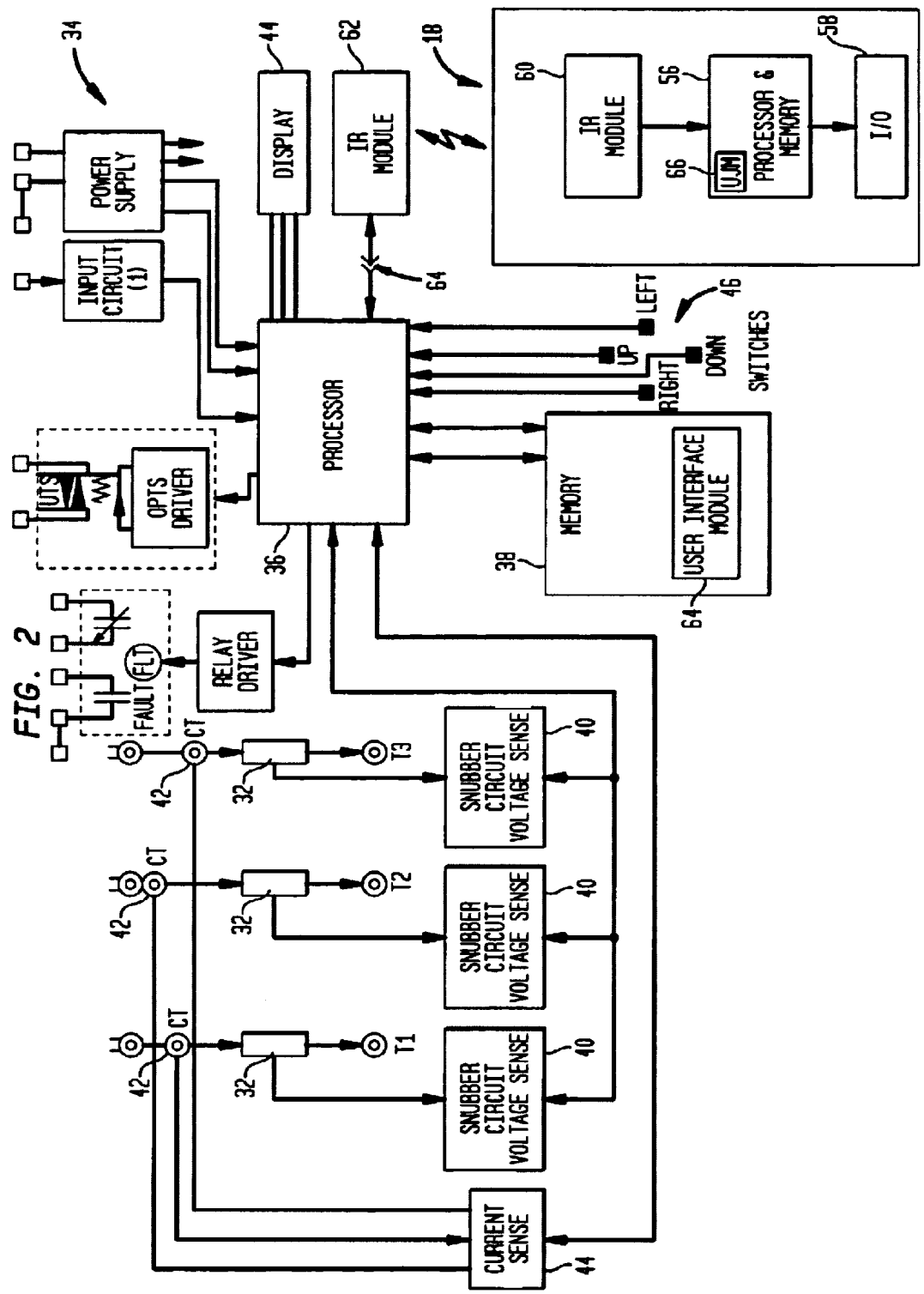
FIG. 2 is a block diagram of the motor control system of FIG. 1.

The SCRs 32 are mounted to the heat sink 26 within the housing 20. Referring also to FIG. 2, a control circuit 34 is also enclosed in the housing 20. The control circuit 34 controls operation of the SCRs 32. Particularly, the control circuit 34 includes a programmed processor 36, such as a digital signal processor, for commanding operation of the SCRs 32. A memory 38 is connected to the processor 36 and stores configuration information relating to operation of the solid state switches, as described below.

The processor 36 is connected to three interface circuits 40 each for connection to one of the SCRs 32. Particularly, the interface circuits 40 comprise snubber circuits for driving the SCRs 32 and voltage sense circuits for sensing voltage across the SCRs 32. A current transformer 42 senses current of each of the SCRs 32 and is connected to a current sense circuit 44. Other types of current sensors could be used. The current sense circuit 44 is also connected to the processor 36.

An LCD display 44 on the cover 22, see FIG. 1, is connected to the processor 36. The display 44 is used to indicate configuration settings, operating values, fault conditions, and the like. User actuable switches 46 are electrically connected to the processor 36. The user actuable switches 46 are actuated by actuator elements 48 on the housing cover 22, see FIG. 1. Particularly, the switches 46 are used for locally selecting parameters for stored configuration information.

In accordance with the invention, the motor controller system 16 is adapted for remote configuration with an external device in the form of the remote configuration device 18. Particularly, in the illustrated embodiment of the invention, the remote configuration device 18 comprises a personal digital assistant (PDA). The PDA 18 includes a housing 50 supporting a display 52 and having user input devices in the form of push buttons 54. The construction of the PDA 18 is conventional in nature and does not form part of the invention. Instead, the invention relates to use of the PDA 18 as an external device for configuring operation of the motor controller 20.

Referring also to FIG. 2, the PDA 18 includes a processor and memory 56, an input/output (I/O) block 58 and an infrared (IR) module 60. The I/O block 58 consists of the display 52 and push buttons 54. The IR module 60 comprises an infrared communication module being a standard element on commercially available PDAs.

In accordance with the invention, an infrared module 62 is mounted to the motor controller cover 22 and is electrically connected to the processor 36 via a connector 64. The IR module 62 allows communications with the PDA 18 via a wireless communication path 63. The infrared module 62 provides necessary voltage isolation with the PDA 18.

The present invention is described utilizing a PDA 18 with infrared communication. As is apparent, an external device in the form of laptop computer or the like using infrared communication could likewise be used. Alternatively, an external device could be hard wired to the connector 64 for configuration. While the illustrated embodiment of the invention shows a wireless interface using infrared communications, other forms of wireless interface could be used as will be apparent to those skilled in the art. It should also be appreciated that the motor controller 20 could be configured or monitored from an external device over a network, such as the internet. As such, the communication path 63 can represent the network or the external device 18 could be connected to the network in a conventional manner.

In accordance with the invention, the motor controller system 16 includes a local user interface in the form of the push buttons 48 and display 44 on the housing 22 for updating stored configuration information in the memory 38. Alternatively, a remote user interface is provided in the form of the external counter remote configuration device 18 for selecting parameters for the stored configuration information.

As is conventional, the processor 36 operates in accordance with various programs stored in the memory 38 to control the SCRs 32. In accordance with the invention, the software programs include a user interface module 64. The user interface module comprises a routine for updating configuration information such as functions and ranges as well as diagnostic information, and the like, as described below. The user interface module 64 stores operational parameters and operating values which are accessible via the local interface or the remote interface. Particularly, under normal operation, the local interface is used. If a remote configuration device is positioned in proximity to the motor controller 20, then the software user interface module 64 alternatively uses the remote interface I/O block 58 for configuration. However, as will be appreciated, the PDA 18 having a larger display 52 may be configured to display more detailed information than would the local display 44. To do this the PDA processor and memory 56 must also include software in the form of a user interface module 66 to operate with the motor controller user interface module 64. The PDA user interface module 66 is essentially a routine for displaying information from the motor controller 20 and transmitting input information to the motor controller 20.

Figure 3:
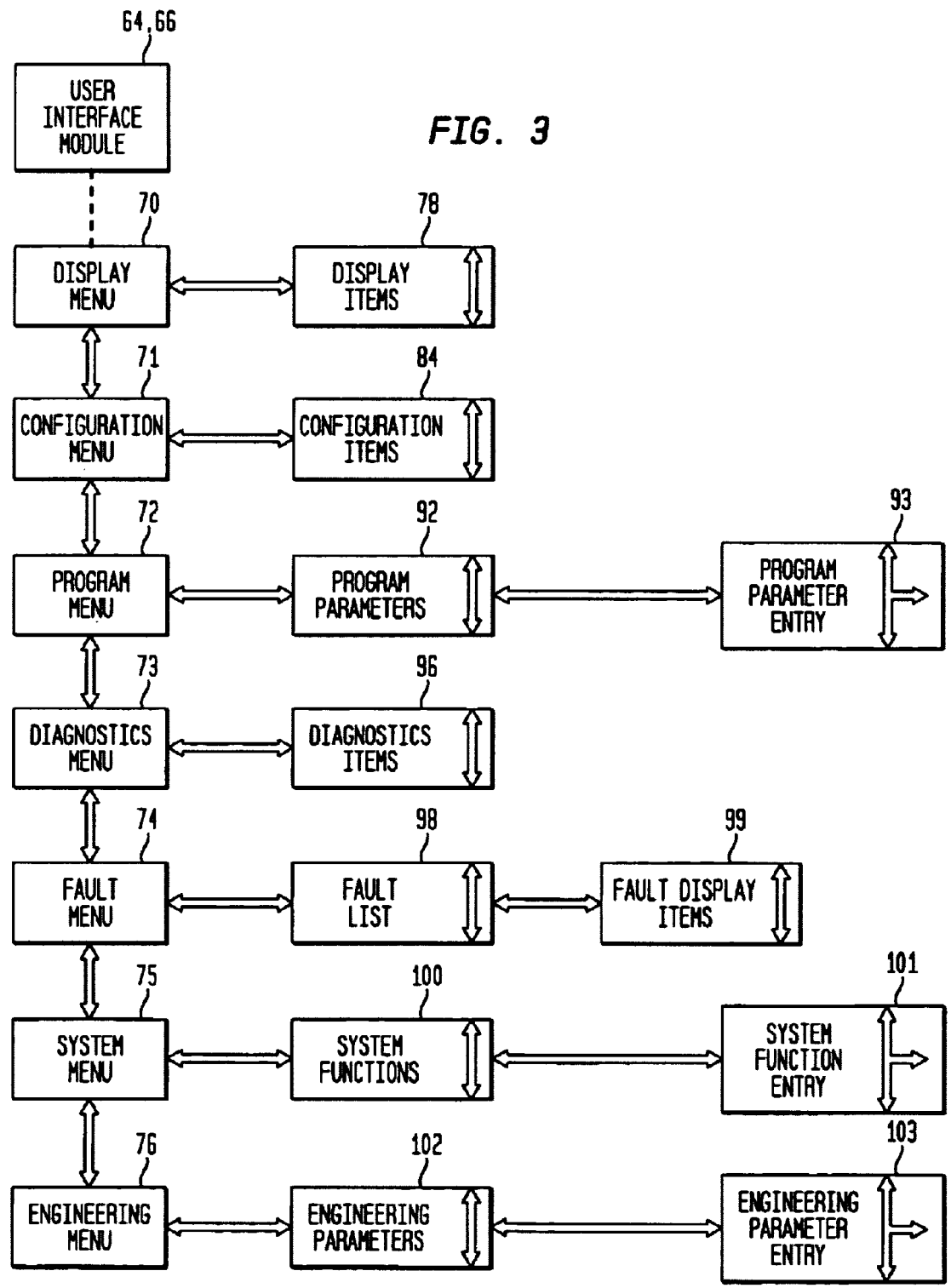
FIG. 3 is a flow diagram illustrating a user interface module implemented by the control system of FIG. 2.

With reference to FIG. 3, a flow diagram illustrates operation of the user interface modules 64 and 66. As discussed above, operating parameters and values are stored in the motor controller memory 38. The software for configuring these parameters resides generally in the motor controller user interface module 64. The portions of the software relating to the user interface reside in both the motor controller memory 38 and the external device processor and memory 56. How the software illustrated in FIGS. 3–11 is divided between the user interface modules 64 and 66 may be determined according to memory requirements and the like to provide efficient communications on the communication path 63.

The user interface module software, as shown in FIG. 3, uses a menu hierarchy. Initially, the user can scroll using up and down switches locally or remotely to select among the different menus including a display menu 70, a configuration menu 71, a program menu 72, a diagnostics menu 73, a fault menu 74, a system menu 75, and an engineering menu 76. From any of these menus 70–76, the user can use left and right switches of the local or remote user interface to select the particular menu.

For example, if the display menu 70 is selected, then the user can access a display items routine 78 using a right arrow key. The display items routine is shown in FIG. 4. The display items routine initially shows a default display 80. The default display, shown in FIG. 5, comprises a series of displays the user can scroll through to provide status information for operation of the motor controller 20. From the default display 80, the user can use the up and down keys, as shown by up and down arrows in FIG. 4, to scroll and view specific operating values. For example, a block 81 illustrates operating values for line to line voltages between the phases. A block 82 illustrates motor current for each phase. For many of these blocks, the left and right arrow keys can be used to return to the display menu 70, see FIG. 3. The display items block includes other operating values shown in FIG. 4 and not described in detail herein.

Figure 6:
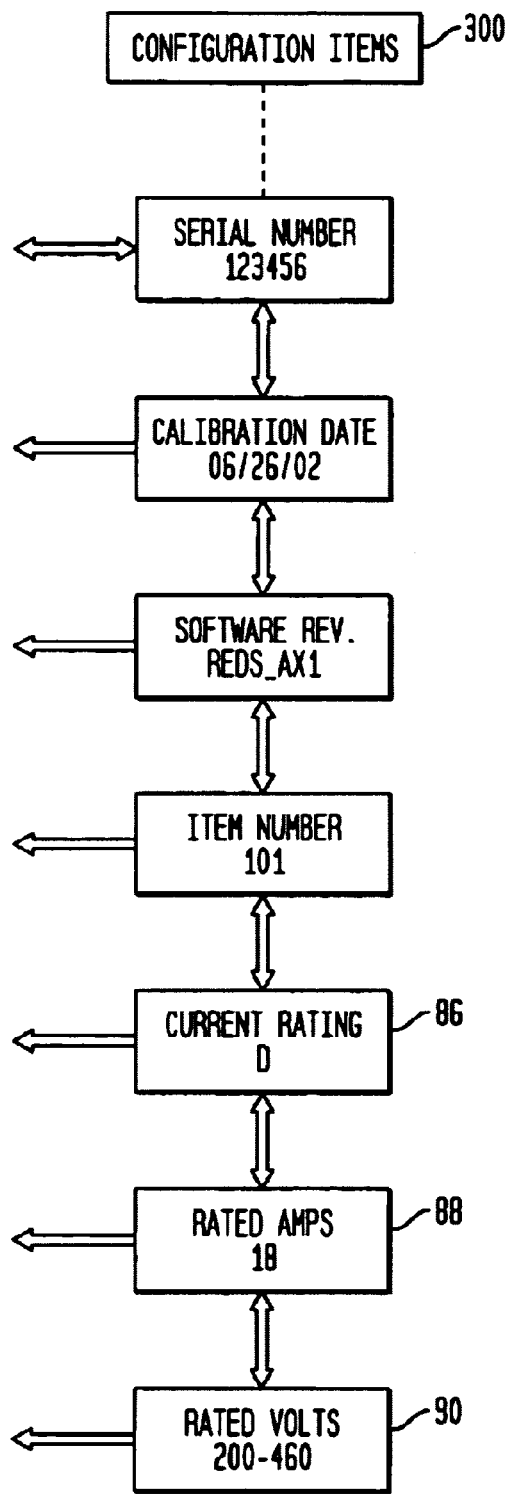

If the user selects the configuration menu 71, see FIG. 3, then the program moves to the configuration items routine 84. The configuration items routine 84 is illustrated in FIG. 6. The configuration items routine is used to display operating parameters for the motor controller 20 and a motor controlled thereby. For example, among the configuration items are a current rating value 86, a rated amps value 88 and rated voltage value 90. These are used to view various operating values for the particular motor being controlled. These values are used during motor operation.

Figure 7:
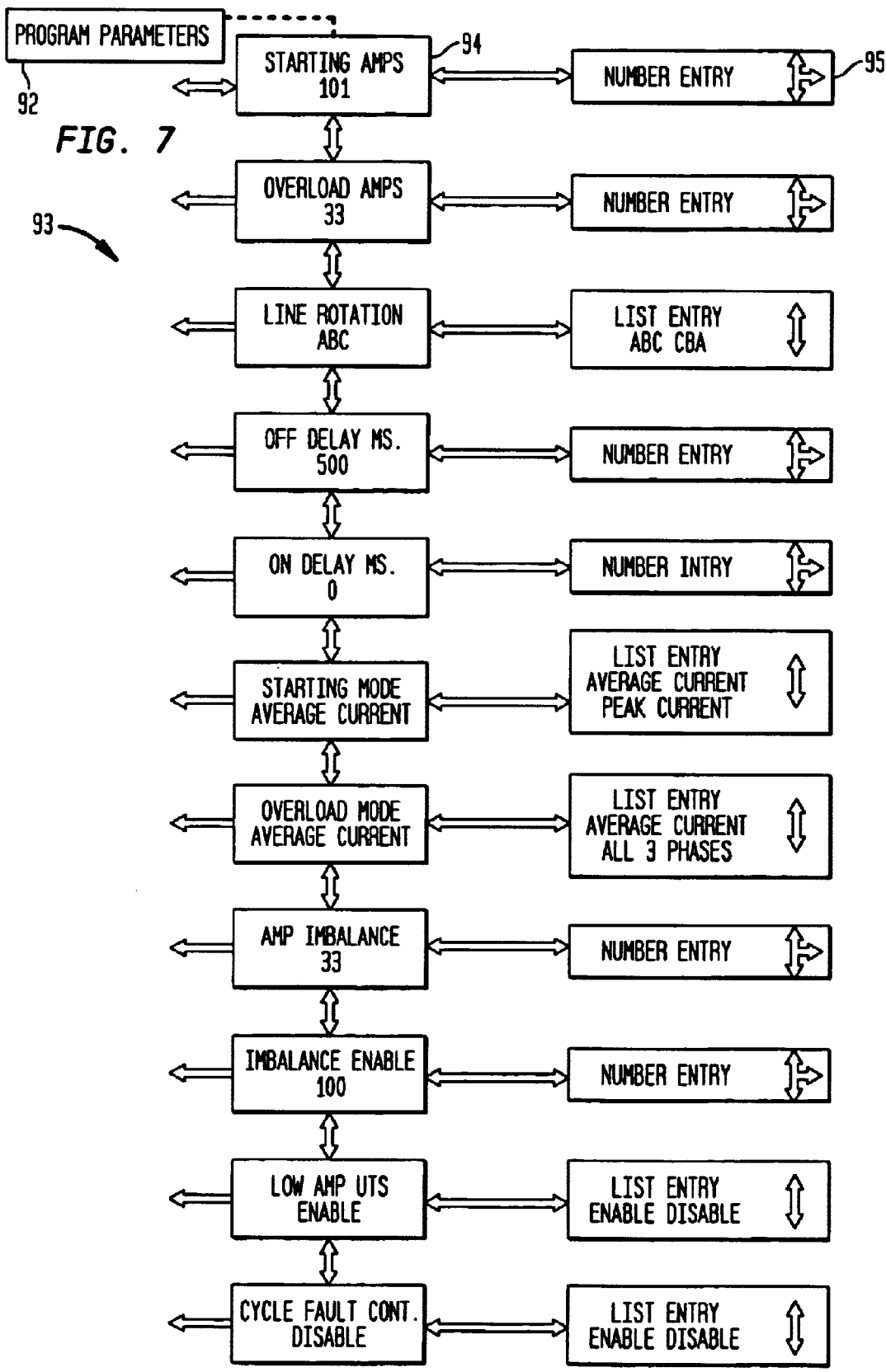

When the user selects the program menu 72, the program parameters routine 92 is initiated. When the program parameters routine 92 is initiated, program parameter entries can be made in the block 93. The program parameters block 92 is illustrated in FIG. 7 listing various program parameters in the left column that can be changed and a right column 93 illustrating how program parameter entry is accomplished. For example, a starting amps block 94 illustrates the program starting amps value. The left and right switches are used to move to a number entry block 95 which is used to increase or decrease the starting amps value. When an appropriate value is selected, then the user returns to the starting amps block 94. Additionally, the following values, shown in FIG. 7, can be similarly configured:

STARTING AMPS
OVERLOAD AMPS
LINE ROTATION
OFF DELAY
ON DELAY
STARTING MODE
OVERLOAD MODE
AMP IMBALANCE
IMBALANCE ENABLE
LOW AMP UTS
CYCLE FAULT CONTROL

As the use and meaning of these particular parameters are known to those skilled in the art they are not described in detail herein.

Figure 8:
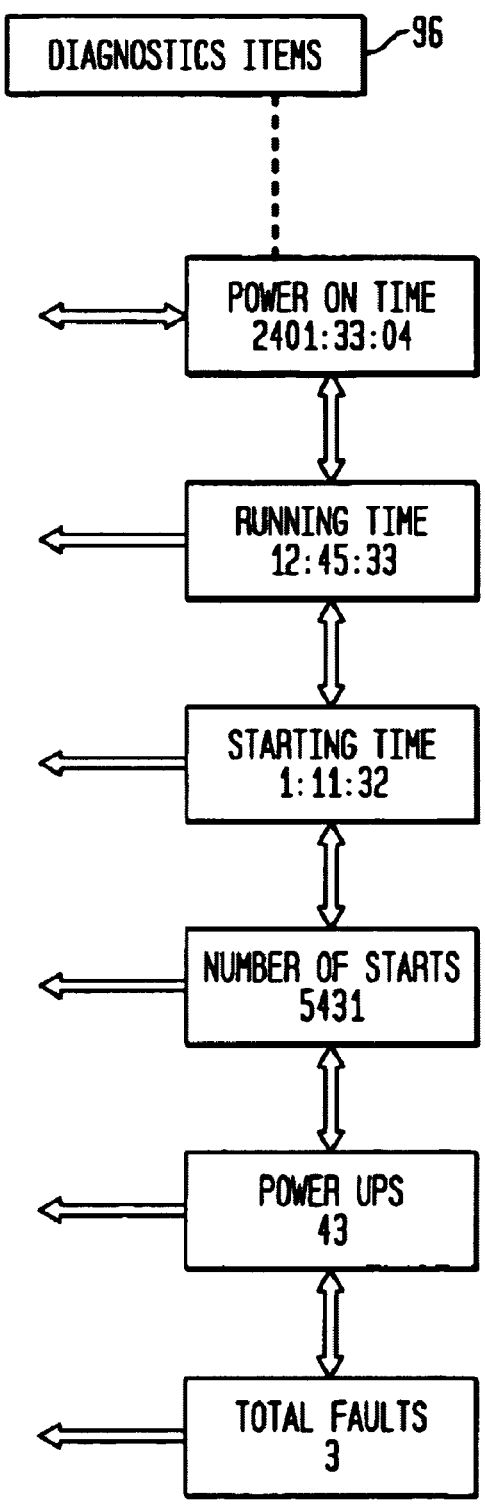

When the user selects the diagnostics menu 73, see FIG. 3, a diagnostics item routine 96 is implemented. The diagnostics items routine 96 is illustrated in FIG. 8. This routine is used to display diagnostic information including:

POWER ON TIME
RUNNING TIME
STARTING TIME
NUMBER OF STARTS
POWER UPS
TOTAL FAULTS

Figure 9:
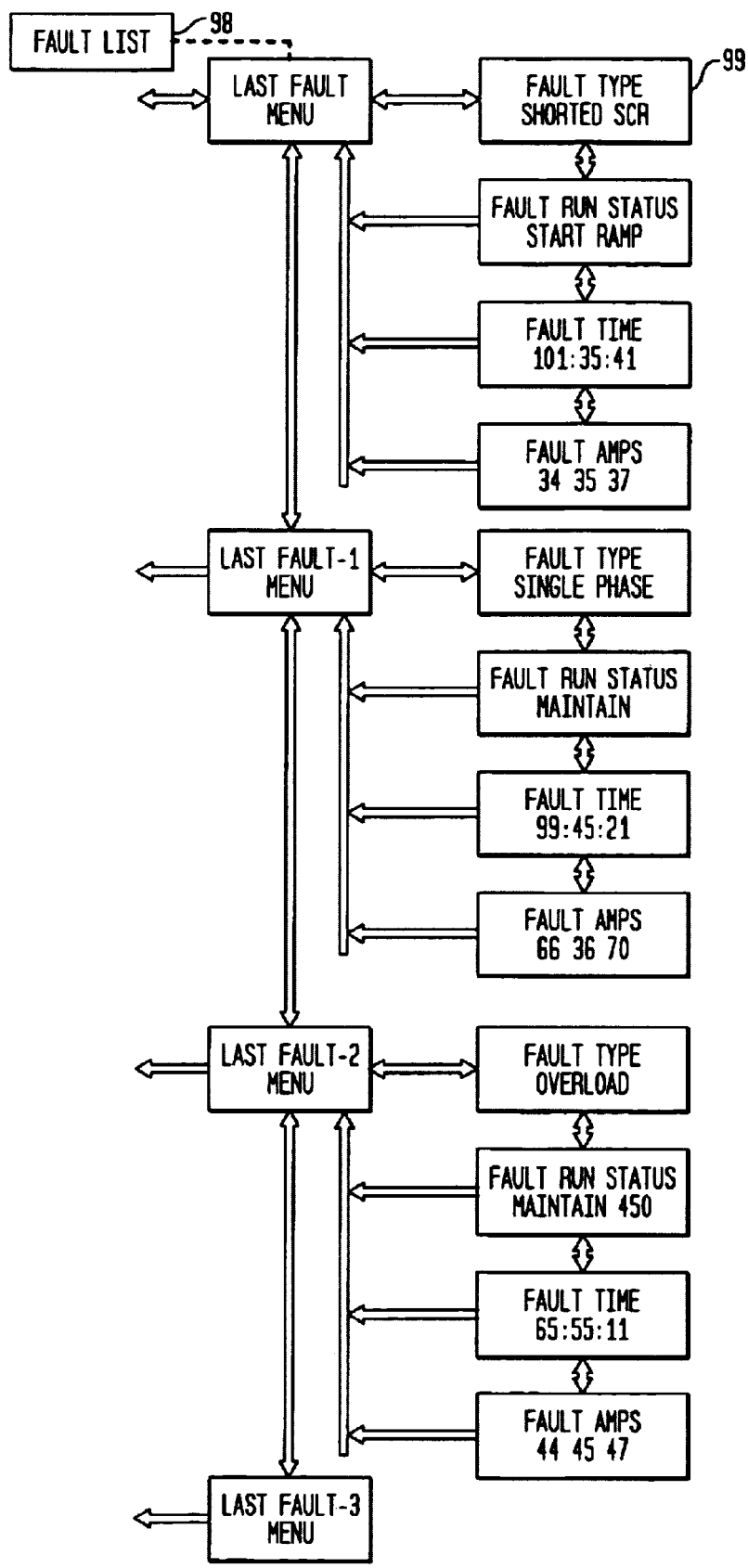

If the user selects the fault menu 74, see FIG. 3, the program moves to a fault list routine 98 which includes a fault display item routine 99. The fault list routine 98 is shown in FIG. 9 and includes the right most column showing the fault display items 99. As is apparent, the fault list shows specific information relating to faults sensed by the motor controller 20.

Figure 10:
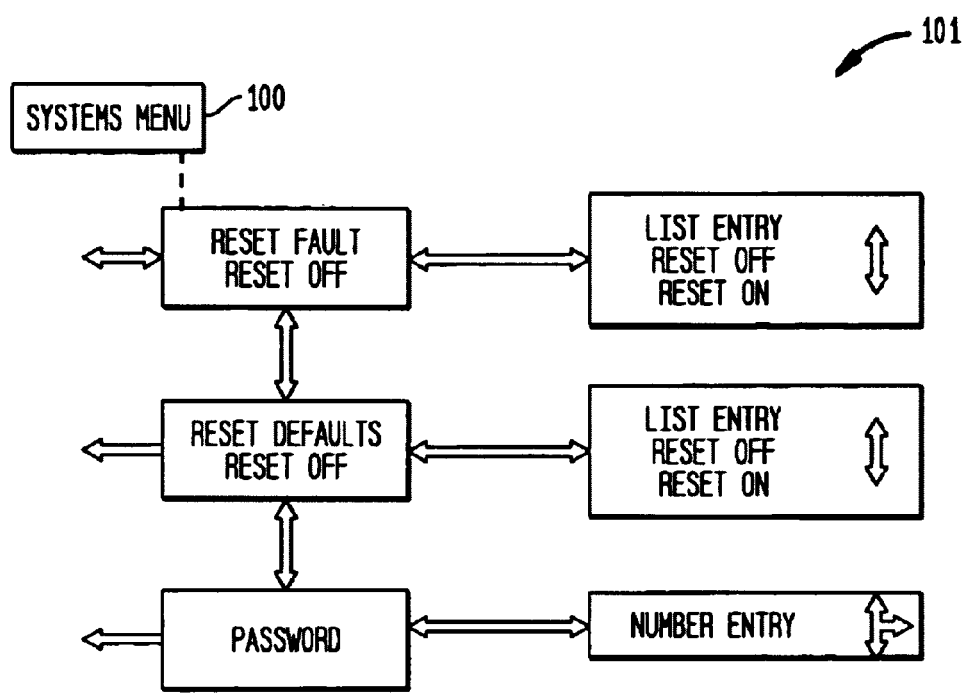

If the system menu routine 75, see FIG. 3, is selected, then a system functions routine 100 and related system function entry 101 are selected. The systems function routine is illustrated in FIG. 10 along with the right most column showing system function entry 101. The systems function routine 100 is used for resetting faults, default values, and password entry.

Figure 11:
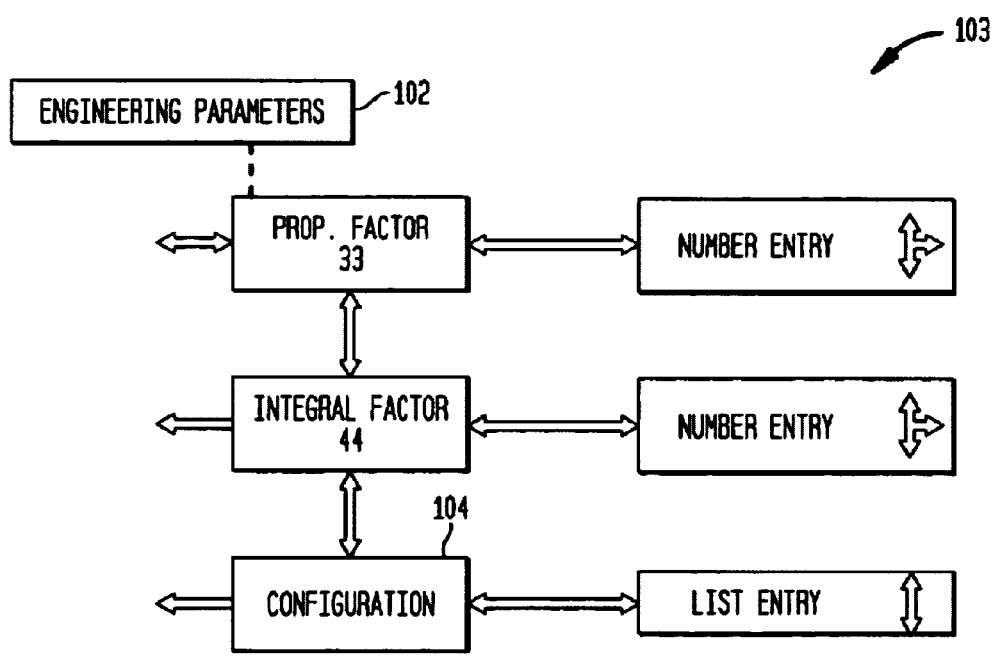

Finally, if an engineering menu routine menu 76, see FIG. 3, is selected, then an engineering parameter routine 102 is entered which includes engineering parameter entry 103. The engineering parameters routine 102 is illustrated in FIG. 11 along with the right most column illustrating the engineering parameter entry 103. The engineering parameters are used to configure proportional and integral factors for controller motor operation along with selecting configuration for particular type devices operated by the motor controller 20. For example, the motor controller 20 may be used as an elevator starter. The configuration block 104 may be used to select among standard configurations provided for particular elevator manufacturers.

Thus, the end user has an improved user interface both in the form of a local interface and a remote interface using the external device 18. The use of the external device 18 enables the user to change parameters without physically contacting the motor controller 20. Instead, the communication path 63 is used to communicate between the infrared modules 60 and 62, see FIG. 2.

It can therefore be appreciated that a new and novel system and method for configuring a motor controller with an external device has been described. It will be appreciated by those skilled in the art that, given the teaching herein, numerous alternatives and equivalents will be seen to exist which incorporate the disclosed invention. As a result, the invention is not to be limited by the foregoing exemplary embodiments, but only by the following claims.

We claim:

1. A method of configuring a motor controller with an external device, comprising:

providing the motor controller to include solid state switches for connection between an AC line and motor terminals for controlling application of AC power to the motor, and a control circuit for controlling operation of the solid state switches, the control circuit comprising a programmed processor for commanding operation of the solid state switches, and a memory circuit connected to the programmed processor storing configuration information relating to operation of the solid state switches;

providing the external device to include a remote user interface for selecting parameters for the stored configuration information; and establishing wireless communications between the programmed processor and the external device so that the user interface is operable to configure the motor controller by updating the stored configuration information using the selected parameters.

2. The method of configuring a motor controller with an external device of claim 1 wherein establishing wireless communications between the programmed processor and the external device comprises providing a wireless communication module operatively connected to the programmed processor.

3. The method of configuring a motor controller with an external device of claim 1 wherein establishing wireless communications between the programmed processor and the external device comprises connecting a wireless communication module to a connector, the connector being operatively connected to the programmed processor.

4. The method of configuring a motor controller with an external device of claim 1 wherein the motor controller is further provided with a local user interface operatively connected to the programmed processor for alternatively selecting parameters for the stored configuration information locally.

5. The method of configuring a motor controller with an external device of claim 1 wherein establishing wireless communications between the programmed processor and the external device comprises providing an infrared communication path between the programmed processor and the external device.

6. A remotely configurable motor controller system, comprising:

a motor controller including solid state switches for connection between an AC line and motor terminals for controlling application of AC power to the motor, and a control circuit for controlling operation of the solid state switches, the control circuit comprising a programmed processor for commanding operation of the solid state switches, and a memory connected to the programmed processor storing configuration information relating to operation of the solid state switches; and a wireless communication interface operatively connected to the programmed processor; and a remote configuration device including a remote user interface for selecting parameters for the stored configuration information and a wireless communication interface for wireless communication with the motor controller so that the user interface is operable to configure the motor controller by updating the stored configuration information using the selected parameters.

7. The remotely configurable motor controller system of claim 6 wherein the motor controller wireless communication interface comprises a wireless communication module operatively connected to the programmed processor.

8. The remotely configurable motor controller system of claim 6 wherein the wireless communication module comprises a connector for removably connecting to the programmed processor.

9. The remotely configurable motor controller system of claim 6 wherein the motor controller further comprises a local user interface operatively connected to the programmed processor for alternatively selecting parameters for the stored configuration information locally.

10. The remotely configurable motor controller system of claim 6 wherein each of the wireless communication interfaces communicates using infrared signals.

11. A remotely configurable motor controller system, comprising:

a housing;

solid state switches in the housing for connection between an AC line and motor terminals for controlling application of AC power to the motor;

a control circuit in the housing for controlling operation of the solid state switches, the control circuit comprising a programmed processor for commanding operation of the solid state switches, and a memory connected to the programmed processor storing configuration information relating to operation of the solid state switches;

a wireless communication interface module mounted to the housing and operatively connected to the programmed processor; and a remote configuration device including a remote user interface for selecting parameters for the stored configuration information and a wireless communication interface for wireless communication with the wireless communication interface module so that the user interface is operable to configure the control circuit by updating the stored configuration information using the selected parameters.

12. The remotely configurable motor controller system of claim 11 wherein the wireless communication module comprises a connector for removably connecting to the programmed processor.

13. The remotely configurable motor controller system of claim 11 further comprising a local user interface on the housing operatively connected to the programmed processor for alternatively selecting parameters for the stored configuration information locally.

14. The remotely configurable motor controller system of claim 11 wherein each of the wireless communication interfaces communicates using infrared signals.

15. The remotely configurable motor controller system of claim 11 wherein the remote configuration device comprises a network.

16. The remotely configurable motor controller system of claim 11 wherein the remote configuration device comprises an Internet connected device including the remote user interface.

17. A remotely configurable motor controller system, comprising:

a housing;

solid state switch means in the housing for connection between an AC line and motor terminals for controlling application of AC power to the motor;

control means in the housing for controlling operation of the solid state switches, the control means being programmable for commanding operation of the solid state switches, and memory means for storing configuration information relating to operation of the solid state switches;

first wireless communication means operatively connected to the control means; and a remote configuration means including a remote user interface for selecting parameters for the stored configuration information and a second wireless communication means for wireless communication with the first wireless communication means so that the user interface is operable to configure the control means by updating the stored configuration information using the selected parameters.

18. The remotely configurable motor controller system of claim 17 wherein the first wireless communication means comprises a module including a connector for removably connecting to the housing.

19. The remotely configurable motor controller system of claim 17 further comprising a local user interface on the housing operatively connected to the control means for alternatively selecting parameters for the stored configuration information locally.

20. The remotely configurable motor controller system of claim 17 wherein each of the wireless communication means communicates using infrared signals.

21. A remotely configurable elevator starter system, comprising:

a motor controller including solid state switches for connection between an AC line and motor terminals for controlling application of AC power to an elevator motor, and a control circuit for controlling operation of the solid state switches, the control circuit comprising a programmed processor for commanding operation of the solid state switches, and a memory connected to the programmed processor storing configuration information relating to operation of the solid state switches; and a wireless communication interface operatively connected to the programmed processor; and a remote configuration device including a remote user interface for selecting parameters for the stored configuration information and a wireless communication interface for wireless communication with the motor controller so that the user interface is operable to configure the motor controller by updating the stored configuration information using the selected parameters.

* * * * *

UNITED STATES PATENT AND TRADEMARK OFFICE
CERTIFICATE OF CORRECTION

PATENT NO. : 6,984,950 B2
DATED : January 10, 2006
INVENTOR(S) : Gregg Jonsson et al.

It is certified that error appears in the above-identified patent and that said Letters Patent is hereby corrected as shown below:

<u>Title page,</u>
Item [75], Inventor, change "Glenn Orin Ray" to -- Glenn Owen Ray --.

Signed and Sealed this

Thirtieth Day of May, 2006

JON W. DUDAS
*Director of the United States Patent and Trademark Office*